(12) United States Patent
Yang et al.

(10) Patent No.: US 8,896,379 B2
(45) Date of Patent: Nov. 25, 2014

(54) ERROR AMPLIFIER HAVING CASCODE CURRENT SOURCE USING BODY BIASING

(71) Applicants: Electronics and Telecommunications Research Institute, Daejeon (KR); Industry-Academic Cooperation Foundation, Dankook University, Gyeonggi-do (KR)

(72) Inventors: Yil Suk Yang, Daejeon (KR); Jongdae Kim, Daejeon (KR); Yong-Seo Koo, Seoul (KR)

(73) Assignees: Electronics and Telecommunications Research Institute, Daejeon (KR); Industry-Academic Cooperation Foundation, Dankook University, Gyeonggi-Do (KR)

( * ) Notice: Subject to any disclaimer, the term of this patent is extended or adjusted under 35 U.S.C. 154(b) by 36 days.

(21) Appl. No.: 13/841,512

(22) Filed: Mar. 15, 2013

(65) Prior Publication Data

US 2014/0152386 A1    Jun. 5, 2014

(30) Foreign Application Priority Data

Dec. 3, 2012  (KR) .......................... 10-2012-0139070

(51) Int. Cl.
     *H03F 3/45*  (2006.01)
(52) U.S. Cl.
     CPC .. *H03F 3/45192* (2013.01); *H03F 2203/45508* (2013.01); *H03F 2203/45244* (2013.01)
     USPC .......................................... 330/261; 330/257
(58) Field of Classification Search
     CPC ....................................................... H03F 3/45
     USPC ........................................... 330/261, 257, 254
     See application file for complete search history.

(56) References Cited

U.S. PATENT DOCUMENTS

| | | | | |
|---|---|---|---|---|
| 5,457,426 | A | * | 10/1995 | Brehmer ........................ 330/253 |
| 6,018,267 | A | * | 1/2000 | Tran et al. ...................... 330/253 |
| 7,525,381 | B2 | * | 4/2009 | Murden et al. ................. 330/261 |
| 7,719,358 | B2 | * | 5/2010 | Hsu et al. ....................... 330/253 |

OTHER PUBLICATIONS

Tadahiro Kuroda et al., "A 0.9-V, 150-MHz, 10-mW, 4 mm$^2$, 2-D Discrete Cosine Transform Core Processor with Variable Threshold-Voltage (VT) Scheme", IEEE Journal of Solid-State Circuits, Nov. 1996, pp. 1770-1779, vol. 31, No. 11.

Dong-Geon Lee et al., "A Rail-to-Rail CMOS Op-amp with Constant Gain by Using Output Common Mode Current Compensation", IEEK Summer Conference 2008, vol. 31 No. 12.

* cited by examiner

*Primary Examiner* — Henry Choe
(74) *Attorney, Agent, or Firm* — Rabin & Berdo, P.C.

(57) ABSTRACT

Provided is an error amplifier. The error amplifier includes: an amplifying unit receiving first and second input signals and amplifying a voltage difference between the received first and second input signals; a first voltage generating unit generating first and second driving voltages for driving the amplifying unit; a second voltage generating unit generating first and second body voltages to implement a body biasing method; a cascode current source including first to fourth PMOS transistors to provide a bias current to the amplifying unit and the first voltage generating unit; and an output unit outputting a signal of the voltage difference amplified by the amplifying unit, wherein the first and third PMOS transistors receive the first body voltage through a body terminal and the second and fourth PMOS transistors receive the second body voltage through a body terminal.

12 Claims, 3 Drawing Sheets

ERROR AMPLIFIER HAVING CASCODE CURRENT SOURCE USING BODY BIASING

CROSS-REFERENCE TO RELATED APPLICATIONS

This U.S. non-provisional patent application claims priority under 35 U.S.C. §119 of Korean Patent Application No. 10-2012-0139070, filed on Dec. 3, 2012, the entire contents of which are hereby incorporated by reference.

BACKGROUND OF THE INVENTION

The present invention disclosed herein relates to an error amplifier, and more particularly, to an error amplifier having a cascode current source using body biasing.

Recently, mobility increase due to the rapid development of information and communication technology and the development of transportation brings the drastic increases of portable electronic product markets. Simultaneously, a miniaturization trend on a charger or adapter of an electronic product comes to the fore. That is, according to the development of an integrated circuit technology and the cultural needs of the consumers, production and sale of portable multimedia devices having various functions, small area, and light weight are increased.

Accordingly, a battery based portable electronic device such as a smart phone, a navigation system, and an MP3 player is manufactured focusing on size, speed, and power management. Especially, in order to implement a small area, an integrated circuit technology for integrating various chips, used for driving portable devices, into one chip is being developed. That is, in order to realize various functions in the same chip area, an integrated circuit technology having typical circuit characteristics but a reduced area is being developed.

As one of blocks for designing a power management integrated circuit (PMIC), an error amplifier is being designed and developed. An error amplifier detects and amplifies errors of an output voltage and a feedback voltage, and maintains a feedback system to secure circuit stability. Moreover, the error amplifier may change the number of stages for gain according to a usage purpose or may install a compensation stage to obtain the stability of a feedback system, with various structures.

Moreover, the error amplifier may increase the size of a transistor during a design process or makes it in symmetry during a design process in order to obtain the same result as a simulation. Accordingly, the error amplifier may reduce errors occurring during manufacturing processes. Especially, a technology for designing a large area to reduce errors occurring during processes may affect various factors such as parasite component increase, speed, and stability due to the size increase of a transistor. Furthermore, as interest is on the miniaturization of an electronic device, a technology for reducing the size of an IC-chip and providing the same or high performance becomes required. Accordingly, a technology of a circuit design for providing the same performance and a small area is being developed.

SUMMARY OF THE INVENTION

The present invention provides an error amplifier including a cascode current source using body biasing to provide stable current and the same performance with a smaller area.

Embodiments of the present invention provide an error amplifier including: an amplifying unit receiving first and second input signals and amplifying a voltage difference between the received first and second input signals; a first voltage generating unit generating first and second driving voltages for driving the amplifying unit; a second voltage generating unit generating first and second body voltages to implement a body biasing method; a cascode current source including first to fourth PMOS transistors to provide a bias current to the amplifying unit and the first voltage generating unit; and an output unit outputting a signal of the voltage difference amplified by the amplifying unit, wherein the first and third PMOS transistors receive the first body voltage through a body terminal and the second and fourth PMOS transistors receive the second body voltage through a body terminal.

The second voltage generating unit may include first and second NMOS transistors; body terminals of the first and third PMOS transistors may be connected to a gate terminal of the first NMOS transistor to receive the first body voltage; and body terminals of the second and fourth PMOS transistors may be connected to a gate terminal of the second NMOS transistor to receive the second body voltage.

The cascode current source may include a plurality of first PMOS transistors where current is copied in response to the first PMOS transistor and a plurality of second PMOS transistors where current is copied in response to the second PMOS transistor.

Each of body terminals of the plurality of first PMOS transistors may be connected to the gate terminal of the first NMOS transistor to receive the first body voltage; and each of body terminals of the plurality of second PMOS transistors may be connected to the gate terminal of the second NMOS transistor to receive the second body voltage.

The error amplifier may further include a reference current source determining the size of the bias current from the cascode current source.

The error amplifier may further include a resistor generating a driving voltage in the first and second PMOS transistors.

The amplifying unit may include an input unit and an output unit, wherein the input unit may include a first MOS transistor receiving the first input signal and a second MOS transistor receiving the second input signal; and the output unit may include third and fourth MOS transistors amplifying a voltage difference outputted through the first and second MOS transistors.

The output unit may include a fifth transistor providing a driving current to the third transistor and a sixth transistor providing a driving current to the fourth transistor.

Gate terminals of the third and fourth MOS transistors may be connected to each other and receive the first driving voltage from the first voltage generating unit; and gate terminals of the fifth and sixth MOS transistors may be connected to each other and receive the second driving voltage from the first voltage generating unit.

The first voltage generating unit may operate by receiving the bias current from the first current source.

According to a voltage difference between the first and second signals outputted from the third and fourth MOS transistors, the output unit may output the voltage difference through an output terminal.

Gate terminals of the seventh and eighth transistors may be connected to each other and have a current minor type structure.

BRIEF DESCRIPTION OF THE DRAWINGS

The accompanying drawings are included to provide a further understanding of the present invention, and are incor

DETAILED DESCRIPTION OF PREFERRED EMBODIMENTS

Figure 1:
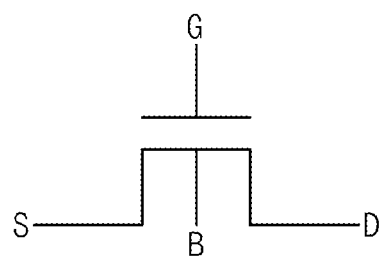
- FIG. 1 is a view of an NMOS transistor used in a CMOS circuit.

Hereinafter, embodiments of the present invention will be described with reference to the accompanying drawings. Rather, these embodiments are provided so that this disclosure will be thorough and complete, and will fully convey the scope of the inventive concept to those skilled in the art. Like reference numerals refer to like elements. Similar components will be cited using similar reference numerals. An error amplifier according to the present invention and operations thereof are just exemplary. That is, person of ordinary skill in the art will understand from the above that various modifications and other equivalent embodiments are also possible.

Figure 2:
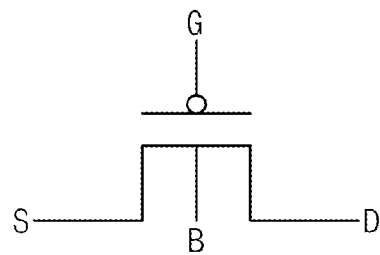
FIG. 2 is a view of a PMOS transistor used in a CMOS circuit.

FIGS. 1 and 2 are views illustrating NMOS and PMOS transistors used in a CMOS circuit. The recent biggest issue in a digital circuit is to integrate more functions in a single chip and provides high performance while minimizing power consumption. In order to reduce power consumption, semiconductor processes are developed and operating voltage becomes lower. However, this causes two big issues. The first is the increase of leakage current and the second is the slowdown due to the non-uniformity and change of a threshold voltage according to incomplete semiconductor processes. To solve these limitations, provided is a body biasing method for increasing the size of current with a stable current source.

Referring to FIGS. 1 and 2, each of the NMOS transistor and the PMOS transistor includes a gate G, a drain D, a source S, and a body B. In a typical CMOS circuit, the terminal of the body B of the NMOS transistor is connected to a ground terminal, and the terminal of the body B of the PMOS transistor is connected to a power terminal in order to supply uniform voltage.

However, when another voltage is applied to the terminal of the body B, a threshold voltage of a transistor is changed. When reverse bias is provided between the terminal of the body B and the terminal of the source S, threshold voltage rises. Accordingly, the speed of a circuit slows down and leakage current is reduced. Also, when forward bias is provided between the terminal of the body B and the terminal of the source S, threshold voltage is lowered. Accordingly, the speed of a circuit becomes fast and leakage current is increased.

A body biasing method may simultaneously solve leakage current issues and the non-uniformity issues of a threshold voltage caused from semiconductor processes, by using the above properties. For example, forward bias is provided between the terminal of the body B and the terminal of the source S in a manufactured circuit with high threshold voltage. Accordingly, the manufactured circuit with high threshold voltage may lower the size of a threshold voltage in response to forward bias so as to provide desired speed. Then, the manufactured circuit with low threshold voltage provides reverse bias between the terminal of the body B and the terminal of the source S. Accordingly, the manufactured circuit with low threshold voltage may raise the size of a threshold voltage in response to reverse bias so as to reduce leakage current while maintaining desired speed.

An error amplifier according to the present invention uses a method of applying forward bias among body biasing methods. When forward bias is provided between the terminal of the body B and the terminal of the source S, a transistor may obtain a large current with respect to the same gate voltage. According to such an increased current, the size of a transistor operating as a current source of an error amplifier may be reduced. That is, when compared to a transistor not using a body biasing method, a transistor providing the same current and having a smaller area may be implemented. Additionally, without changing the size of a transistor, a circuit may operate stably at low power voltage by reducing the size of power voltage.

Figure 3:
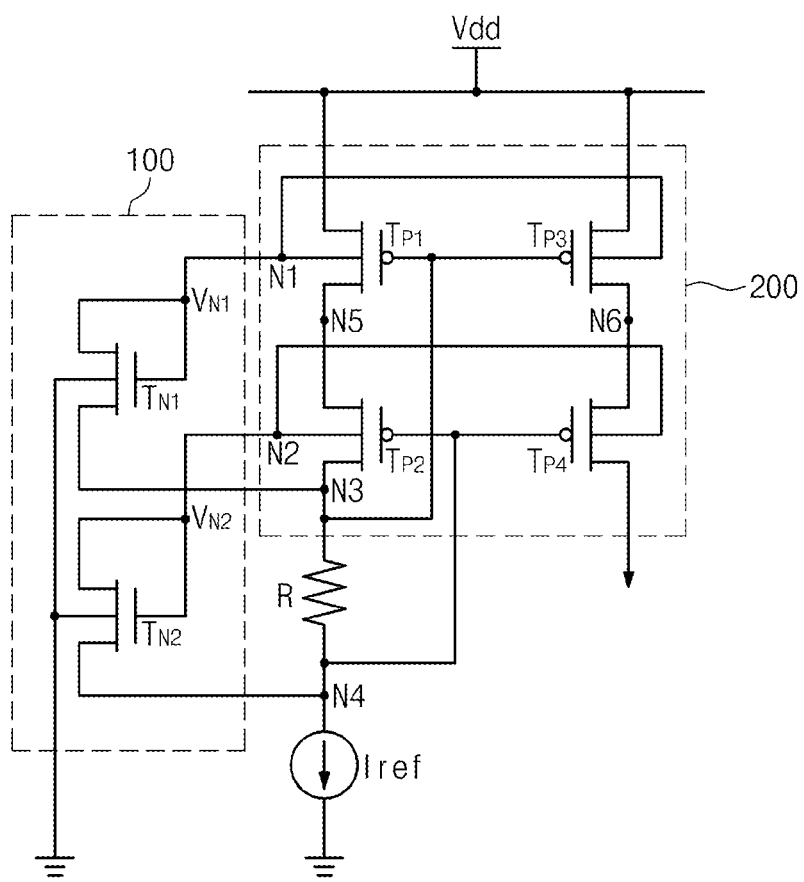
FIG. 3 is a view of a cascode current source using body biasing according to an embodiment of the present invention.

FIG. 3 is a view of a cascode current source using body biasing according to an embodiment of the present invention. Referring to FIG. 3, a first voltage generating unit 100, a cascode current source 200, a resistor R, and a reference current source Iref, which are implemented in an error amplifier, are shown.

The first voltage generating unit 100 includes a first NMOS transistor TN1 and a second NMOS transistor TN2. The first NMOS transistor TN1 is provided between a first node N1 and a third node N3, and has the form of a diode connection structure. Then, the second NMOS transistor TN2 is provided between a second node N2 and a fourth node N4, and has the form of a diode connection structure. The body terminals of the first and second NMOS transistor TN1 and TN2 are connected to ground terminals, respectively. Also, the first voltage generating unit 100 supplies first and second body voltages VN1 and VN2 to the body terminal of each transistor in the cascode current source 200 through a body biasing method.

The cascode current source 200 may amplify the size of current by using the first and second body voltages VN1 and VN2 supplied from the first voltage generating unit 100. The cascode current source 200 includes first to fourth PMOS transistors TP1, TP2, TP3, and TP4 receiving the first and second body voltages VN1 and VN2.

The first PMOS transistor TP1 is provided between a power terminal and a fifth node N5 and the third PMOS transistor TP3 is provided between a power terminal and a sixth node N6. Also, the gate terminals of the first and third PMOS transistors TP1 and TP3 are connected to each other structurally. Additionally, the body terminal of the first PMOS transistor TP1 is connected to the gate terminal of the first NMOS transistor TN1, and the body terminal of the third PMOS transistor TP3 is connected to the first node N1. Accordingly, the body terminal of the first PMOS transistor TP1 receives a first body voltage VN1 supplied through the first NMOS transistor TN1. Also, the body terminal of the third PMOS transistor TP1 receives a first body voltage VN1 through the first node N1.

The second PMOS transistor TP2 is provided between the fifth node N5 and the third node N3 and the fourth PMOS transistor TP4 is provided between the sixth node N6 and an output terminal. Also, the gate terminals of the second and fourth PMOS transistors TP2 and TP4 are connected to each other structurally. Additionally, the body terminal of the second PMOS transistor TP2 is connected to the gate terminal of the second NMOS transistor TN2, and the body terminal of the fourth PMOS transistor TP4 is connected to the second node N2. Accordingly, the body terminal of the second PMOS transistor TP2 receives a second body voltage VN2 supplied through the second NMOS transistor TN2. Then, the body terminal of the fourth PMOS transistor TP4 receives a second body voltage VN2 through the second node N2.

Also, the first and second PMOS transistors TP1 and TP2 are configured with a cascode connection structure form. Also, the third and fourth PMOS transistors TP3 and TP4 are configured with a cascode connection structure form.

Moreover, the first and second PMOS transistors TP1 and TP2 may serve to copy current to the third and fourth PMOS transistors TP3 and TP4 in response to a reference current source Iref. The first and second PMOS transistors TP1 and TP2 and the third and fourth PMOS transistors TP3 and TP4 have a current mirror type structure. A current flowing through the first and second PMOS transistors TP1 and TP2 is copied to the third and fourth PMOS transistors TP3 and TP4 at a predetermined rate. The degree of copying current to the third and fourth PMOS transistors TP3 and TP4 may vary depending on the reference current source Iref and the aspect ratio (L/W) of the first and second transistors TP1 and TP2. Thus, a current required to drive a circuit may be copied according to the reference current resource Iref, by using a current minor structure.

Also, the gate terminals of the first and third PMOS transistors TP1 and TP3 receive a gate voltage through a wire connected to an upper part of the resistor R. The gate terminals of the second and fourth PMOS transistors TP2 and TP4 receive a gate voltage through a wire connected to a lower part of the resistor R.

Thus, the cascode current source 200 having a current minor structure using a cascode method may supply a more stable current source than a current minor structure using a single transistor and may extend an output voltage When a voltage lower than the voltage of a source terminal is applied to the body terminal of the PMOS transistor, forward bias voltage is applied to a P-N junction of a source-body connection. Accordingly, when a portion where a channel of a PMOS transistor is to be formed becomes larger, a current size may be relatively increased.

Also, a voltage to be applied to the body terminal of a PMOS transistor is set to be less than about 0.7 V, and a voltage between the source-body terminals of a PMOS transistor may be set to about 0.4 V. The reason for setting a voltage between a source and a body in such a manner is that the current conductivity of a current minor is increased as a voltage applied to the body terminal of a PMOS transistor is smaller than a source voltage. If the increase degree of current conductivity is increased more than a voltage for turning on a P-N diode, large leakage current flows at a power voltage Vdd through the body terminal of a PMOS transistor. Due to this, as overall current consumption is drastically increased and efficiency is reduced, so that a transistor may be damaged according to a leakage current value.

Additionally, in each PDS transistor of the cascode current source 200, a voltage applied to a body terminal has the same size change in response to the size change of a power voltage Vdd applied to a source terminal. Accordingly, a voltage between source and body terminals of each PMOS transistor may be maintained uniformly. Thus, the cascode current source 200 has the same characteristics with respect to the change of an external power voltage Vdd, and thus, operates stably.

A transistor using body biasing may obtain a larger current with respect to the same gate voltage as forward bias voltage is applied to a body terminal. Accordingly, when compared to a transistor not using a body biasing method, a transistor providing the same current and having a smaller area may be implemented. Accordingly, the overall size of the cascode current source 200 may be reduced.

Figure 4:
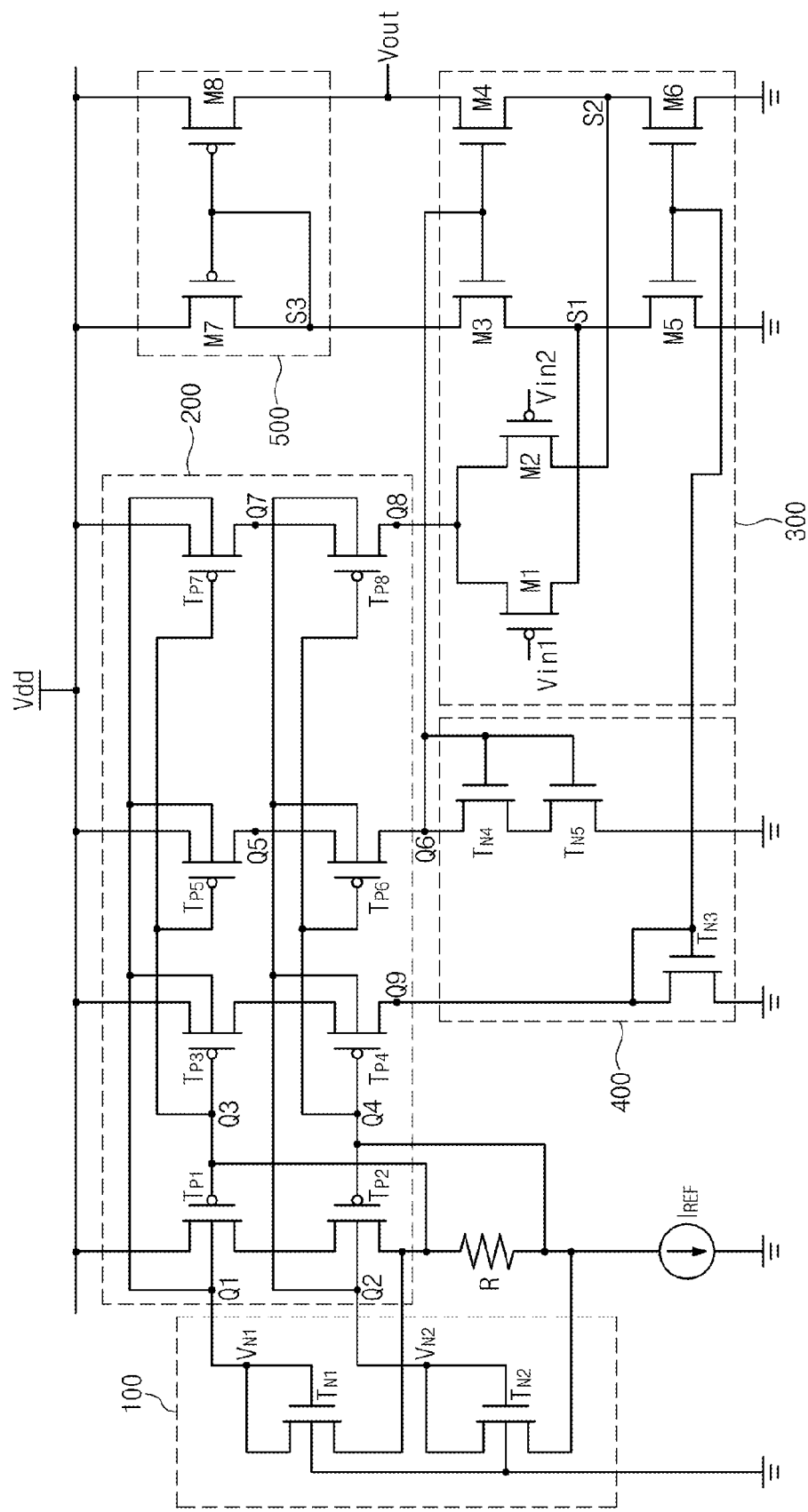
FIG. 4 is a view of an error amplifier according to an embodiment of the present invention.

FIG. 4 is a view of an error amplifier according to an embodiment of the present invention. Referring to FIG. 4, a first voltage generating unit 100, a cascode current source 200, a folded cascode amplifier 300, a second voltage generating unit 400, and an output unit 500. FIG. 4 is a view of an error amplifier including a cascode current source 200 using the body biasing method of FIG. 3.

The first voltage generating unit 100 and the cascode current source 200 have the same structure as one in FIG. 3 and the cascode current source 200 further includes fourth to eighth PMOS transistors TP5, TP6, TP7, and TP8. The fifth PMOS transistor TP5 is connected to a power terminal and a fifth node Q5, and the seventh PMOS transistor TP7 is connected to the power terminal and a seventh node Q7. Also, the body terminals of the fifth and seventh PMOS transistors TP5 and TP7 are connected a first node Q1 and their gate terminals are connected to a third node Q3.

Also, the fifth PMOS transistor TP6 is connected to the fifth node Q5 and a sixth node Q6, and the eighth PMOS transistor TP8 is connected to a seventh node Q7 and an eighth node Q8. Also, the body terminals of the sixth and eighth PMOS transistors TP6 and TP8 are connected a second node Q2 and their gate terminals are connected to a fourth node Q4.

Additionally, the fifth and seventh PMOS transistors TP5 and TP7 are configured with a cascode connection structure form, and the sixth and eighth PMOS transistors TP6 and TP8 are configured with a cascode connection structure form. Moreover, in relation to the cascode current source 200, as a form of a current mirror using cascode, current is copied to each of the third to eighth PMOS transistors TP3, TP4, TP5, TP6, TP7, and TP8 on the basis of the first and second PMOS transistors TP1 and TP2. Here, a value of the current copied to each transistor may vary according to the aspect ratio (W/L) of a transistor and a reference current source Iref.

Accordingly, the body terminals of the first, third, fifth, and seventh PMOS transistor TP1, TP2, TP3, and TP4 receive a first body voltage VN1 through the first NMOS transistor TN1. In the same manner, the body terminals of the second, fourth, sixth, and eighth PMOS transistor TP2, TP4, TP6, and TP8 receive a second body voltage VN2 through the second NMOS transistor TN2.

Thus, the cascode current source 200 may receive the first and second body voltages VN1 and VN2 using a body biasing method from the first voltage generating unit 100. Here, the first and second body voltages VN1 and VN2 refer to forward bias voltage using a body biasing method. Also, each transistor in the cascode current source 200 may obtain a larger current value with respect to the same gate voltage than a transistor not using a body biasing method. The reason is that since the channel width of a PMOS transistor is activated for a body voltage supplied to the body terminal of each PMOS transistor, more driving current may be generated.

The folded cascode amplifying unit 300 may include an input unit including first and second PMOS transistors M1 and M2 and an output unit including third to sixth NMOS transistors M3, M4, M5, and M6. Additionally, a transistor in the input unit may be implemented with an NMOS transistor. However, the transistor is not limited thereto, and thus may be implemented with a PMOS transistor.

The first and second PMOS transistors M1 and M2 having a structure of a differential amplifier receive first and second input signals Vin1 and Vin2. The first PMOS transistor M1 is provided between an eighth node Q8 and a first node S1 and the second PMOS transistor M2 is provided between the eighth node Q8 and a second node S2. Moreover, the first and second PMOS transistors M1 and M2 amplify a voltage difference between the received first and second input signals Vin1 and Vin2. The third and fourth NMOS transistors M3 and M4 may further increase an amplification factor with respect to an amplified voltage difference from the first and second PMOS transistors M1 and M2. Here, the third NMOS transistor M3 is provided between the first node S1 and the third node S3, and the fourth NMOS transistor M4 is provided between the second node S2 and an output terminal.

Also, the gate terminals of the fifth and sixth NMOS transistors M5 and M6 are connected to each other. The fifth NMOS transistor M5 is connected to the first node S1 and a ground terminal, and the sixth NMOS transistor M6 is connected to the second node S2 and a ground terminal. Also, the fifth and sixth NMOS transistors M5 and M6 may receive a gate voltage from the third NMOS transistor TN3. In such a manner, the fifth and sixth NMOS transistors M5 and M6 may serve as a current source for driving the third and fourth transistors M3 and M4 in response to an applied gate voltage.

The second voltage generating unit 400 includes third to fifth NMOS transistors TN3, TN4, and TN5. The second voltage generating unit 400 may supply a driving voltage for driving the third to sixth NMOS transistors M3, M4, M5, and M6, an output unit of the folded cascode amplifier 300. The third NMOS transistor TN3 is provided between a ninth node Q9 and a ground terminal, and generates a driving voltage to be applied to the gate terminals of the fifth and sixth NMOS transistors M5 and M6. Then, the fourth and fifth NMOS transistor TN5 and TN5 as a cascode structure are provided between the sixth node Q6 and a ground terminal. Then, the fourth and fifth NMOS transistors TN4 and TN5 generate a driving voltage to be applied to the gate terminals of the third and fourth NMOS transistors M3 and M4.

Also, the third to sixth PMOS transistors TP3, TP4, TP5, and TP6 of the cascode current source 200 provide a driving current to drive the third to fifth NMOS transistors TN3, TN4, and TN5 of the second voltage generating unit 400. The third and fourth PMOS transistors TP3 and TP4 provide a driving current to the third NMOS transistor TN3 through the ninth node Q9. Also, the fifth and sixth PMOS transistors TP5 and TP6 provide a driving current to the fourth and fifth NMOS transistors TN4 and TN5 through the sixth node Q6.

The output unit 500 includes seventh and eighth PMOS transistors M7 and M8. The seventh and eighth PMOS transistors M7 and M8 have a current minor structure with the same aspect ratio (W/L). The seventh PMOS transistor M7 is provided between the power terminal and the third node S3, and the eighth PMOS transistor M8 is provided between the power terminal and the output terminal. Also, the gate terminals of the seventh and eighth PMOS transistors M7 and M8 are connected to each other.

Then, when the sizes of the first and second input signals Vin1 and Vin2 are the same, the output unit 500 provides the same current to each end of the third and fourth NMOS transistors M3 and M4. However, if a voltage error occurs at the both ends of the first and second input signals Vin1 and Vin2, the output unit 500 changes an output voltage Vout, and then, transmits the occurred voltage error to an output terminal (not shown).

In such a manner, an error amplifier according to the present invention includes the cascode current source 200 using body biasing. Accordingly, the error amplifier using body biasing provides the same performance and greatly reduces the aspect ratio (W/L) of a current source, compared to a typical error amplifier not using body biasing. Moreover, the error amplifier includes a cascode type current source.

Accordingly, the error amplifier may further reduce the overall area than before when the number of current mirrors is increased.

According to embodiments of the present invention, an error amplifier receives power from a stable current source and provides the same performance with a small area design. Also, an error amplifier according to the present invention is designed in various circuits so that an entire circuit area may be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An error amplifier comprising:
    an amplifying unit receiving first and second input signals and amplifying a voltage difference between the received first and second input signals;
    a first voltage generating unit generating first and second driving voltages for driving the amplifying unit;
    a second voltage generating unit generating first and second body voltages to implement a body biasing method;
    a cascode current source including first to fourth PMOS transistors to provide a bias current to the amplifying unit and the first voltage generating unit; and
    an output unit outputting a signal of the voltage difference amplified by the amplifying unit,
    wherein the first and third PMOS transistors receive the first body voltage through a body terminal and the second and fourth PMOS transistors receive the second body voltage through a body terminal.

2. The error amplifying unit of claim 1, wherein
    the second voltage generating unit comprises first and second NMOS transistors;
    body terminals of the first and third PMOS transistors are connected to a gate terminal of the first NMOS transistor to receive the first body voltage; and
    body terminals of the second and fourth PMOS transistors are connected to a gate terminal of the second NMOS transistor to receive the second body voltage.

3. The error amplifier of claim 2, wherein the cascode current source comprises a plurality of first PMOS transistors where current is copied in response to the first PMOS transistor and a plurality of second PMOS transistors where current is copied in response to the second PMOS transistor.

4. The error amplifier of claim 3, wherein
    each of body terminals of the plurality of first PMOS transistors is connected to the gate terminal of the first NMOS transistor to receive the first body voltage; and
    each of body terminals of the plurality of second PMOS transistors is connected to the gate terminal of the second NMOS transistor to receive the second body voltage.

5. The error amplifier of claim 2, further comprising a reference current source determining the size of the bias current from the cascode current source.

6. The error amplifier of claim 2, further comprising a resistor generating a driving voltage in the first and second PMOS transistors.

7. The error amplifier of claim 2, wherein the amplifying unit comprises an input unit and an output unit,
    wherein the input unit comprises a first MOS transistor receiving the first input signal and a second MOS transistor receiving the second input signal; and the output unit comprises third and fourth MOS transistors amplifying a voltage difference outputted through the first and second MOS transistors.

8. The error amplifier of claim 7, wherein the output unit comprises a fifth MOS transistor providing a driving current to the third MOS transistor and a sixth MOS transistor providing a driving current to the fourth transistor.

9. The error amplifier of claim 8, wherein gate terminals of the third and fourth MOS transistors are connected to each other and receive the first driving voltage from the first voltage generating unit; and gate terminals of the fifth and sixth MOS transistors are connected to each other and receive the second driving voltage from the first voltage generating unit.

10. The error amplifier of claim 9, wherein the first voltage generating unit operates by receiving the bias current from the first current source.

11. The error amplifier of claim 10, wherein according to a voltage difference between the first and second signals outputted from the third and fourth MOS transistors, the output unit outputs the voltage difference through an output terminal.

12. The error amplifier of claim 11, wherein gate terminals of the seventh and eighth MOS transistors are connected to each other and have a current mirror type structure.

* * * * *